United States Patent
Saboundji et al.

(10) Patent No.: US 11,293,290 B2
(45) Date of Patent: Apr. 5, 2022

(54) TURBINE COMPONENT MADE FROM SUPERALLOY COMPRISING RHENIUM AND ASSOCIATED MANUFACTURING PROCESS

(71) Applicant: SAFRAN, Paris (FR)

(72) Inventors: Amar Saboundji, Moissy-Cramayel (FR); Virginie Jaquet, Moissy-Cramayel (FR)

(73) Assignee: SAFRAN, Paris (FR)

( * ) Notice: Subject to any disclaimer, the term of this patent is extended or adjusted under 35 U.S.C. 154(b) by 37 days.

(21) Appl. No.: 16/757,184

(22) PCT Filed: Oct. 17, 2018

(86) PCT No.: PCT/FR2018/052584
§ 371 (c)(1),
(2) Date: Apr. 17, 2020

(87) PCT Pub. No.: WO2019/077271
PCT Pub. Date: Apr. 25, 2019

(65) Prior Publication Data
US 2021/0199016 A1    Jul. 1, 2021

(30) Foreign Application Priority Data

Oct. 20, 2017   (FR) ..................................... 17 01096

(51) Int. Cl.
*F01D 5/28*       (2006.01)
*C23C 4/073*     (2016.01)
(Continued)

(52) U.S. Cl.
CPC .............. *F01D 5/288* (2013.01); *C23C 4/073* (2016.01); *C23C 14/16* (2013.01); *C23C 28/324* (2013.01);
(Continued)

(58) Field of Classification Search
CPC ....... F01D 5/288; F01D 25/005; C23C 4/073; C23C 4/137; C23C 14/16; C23C 28/345; C22C 19/057
See application file for complete search history.

(56) References Cited

U.S. PATENT DOCUMENTS 5,151,249 A *  9/1992  Austin ................. C22C 19/057
                                                        420/445
6,461,746 B1  10/2002  Darolia et al.
(Continued)

FOREIGN PATENT DOCUMENTS

EP        1 939 318 A2     7/2008
WO    WO 2012/146864 A1  11/2012

OTHER PUBLICATIONS

Converting between at% and wt%. Accessed from https://www.southampton.ac.uk/~pasr1/g7.htm on Aug. 26, 2021 (Year: 2021).*
(Continued)

*Primary Examiner* — Topaz L. Elliott
(74) *Attorney, Agent, or Firm* — Oblon, McClelland, Maier & Neustadt, L.L.P.

(57) ABSTRACT

A turbine component includes a substrate made from monocrystalline nickel-based superalloy including rhenium, which has a γ-γ' Ni phase, and an average weight faction of chromium of less than 0.08, a sublayer made from nickel-based metal superalloy covering the substrate, in which the sublayer made from metal superalloy includes at least aluminium, nickel, chromium, silicon, hafnium and has, predominantly by volume, a γ'-Ni 3 Al phase.

14 Claims, 1 Drawing Sheet

(51) Int. Cl.
  *C23C 14/16* (2006.01)
  *C23C 28/00* (2006.01)
  *F01D 25/00* (2006.01)
  *C23C 4/137* (2016.01)
  *C22C 19/05* (2006.01)

(52) U.S. Cl.
  CPC ........ *C23C 28/3215* (2013.01); *C23C 28/345* (2013.01); *F01D 25/005* (2013.01); *C22C 19/057* (2013.01); *C23C 4/137* (2016.01); *F05D 2220/323* (2013.01); *F05D 2230/31* (2013.01); *F05D 2230/311* (2013.01); *F05D 2230/313* (2013.01); *F05D 2260/231* (2013.01); *F05D 2300/132* (2013.01); *F05D 2300/143* (2013.01); *F05D 2300/175* (2013.01); *F05D 2300/182* (2013.01); *F05D 2300/607* (2013.01)

(56) References Cited

U.S. PATENT DOCUMENTS

| | | | |
|---|---|---|---|
| 2003/0035892 A1 | 2/2003 | Darolia et al. | |
| 2004/0142204 A1 | 7/2004 | Zhao et al. | |
| 2005/0112398 A1* | 5/2005 | Darolia | C23C 28/3455 428/632 |
| 2007/0160775 A1* | 7/2007 | Marijnissen | C23C 14/243 427/585 |
| 2010/0276036 A1 | 11/2010 | Hazel et al. | |
| 2010/0330295 A1* | 12/2010 | Hazel | C23C 10/56 427/456 |
| 2013/0142637 A1 | 6/2013 | Harris et al. | |
| 2014/0050940 A1 | 2/2014 | Guedou et al. | |
| 2017/0058405 A1 | 3/2017 | Tang et al. | |

OTHER PUBLICATIONS

Plasma Electronic. Physical Vapor Deposition. Accessed from https://www.plasma-electronics.com/physical-vapor-deposition.html on Aug. 26, 2021 (Year: 2021).*
French Preliminary Search Report dated Mar. 27, 2018 in Patent Application No. FR 1701096 (with English translation of categories of cited documents), 3 pages.
International Search Report dated Jan. 4, 2019 in PCT/FR2018/052584 (with English translation), 6 pages.

* cited by examiner

TURBINE COMPONENT MADE FROM SUPERALLOY COMPRISING RHENIUM AND ASSOCIATED MANUFACTURING PROCESS

FIELD OF THE INVENTION

The invention relates to a turbine part, such as a turbine blade or a nozzle vane for example, used in aeronautics.

RELATED ART

In a turbojet engine, the exhaust gases generated by the combustion chamber can reach high temperatures, above 1200° C. or even 1600° C. The parts of the turbojet engine in contact with these exhaust gases, such as the turbine blades for example, must therefore be able to maintain their mechanical properties at these high temperatures.

For this purpose, it is known to manufacture certain parts of the turbojet engine in "superalloy". Superalloys are a family of high-strength metal alloys that can work at temperatures relatively close to their melting points (typically 0.7 to 0.8 times their melting temperatures).

In order to increase the thermal resistance of these superalloys and to protect them against oxidation and corrosion, it is known to coat them with a coating that acts as a thermal barrier.

FIG. 1 shows a schematic illustration of a section of a turbine component 1, for example a turbine blade 7 or a nozzle vane. The component 1 comprises a substrate 2 made of a single-crystal metal superalloy 2 coated with a thermal barrier 10.

The thermal barrier 10 typically consists of a metal sublayer, a protective layer and a thermally insulating layer. The metal sublayer covers the metal superalloy substrate. The metal sublayer is itself covered by the protective layer, which is formed by oxidation of the metal sublayer. The protective layer protects the superalloy substrate from corrosion and/or oxidation. The thermally insulating layer covers the protective layer. The thermally insulating layer can be made of ceramic, for example yttriated zirconia.

The metal sublayer provides a bond between the surface of the superalloy substrate and the protective layer: the metal sublayer is sometimes referred to as the "bond coat".

A sublayer can be made from single nickel aluminide β-NiAl or modified platinum β-NiAlPt. The average aluminum mass fraction (between 0.35 and 0.45) of the sublayer is sufficient to form exclusively a protective layer of aluminum oxide ($Al_2O_3$) to protect the superalloy substrate against oxidation and corrosion.

However, when the component is subjected to high temperatures, the difference in the concentrations of nickel, and especially aluminum, between the superalloy substrate and the metal sublayer leads to diffusion of the various elements, in particular nickel from the substrate to the metal sublayer, and aluminum from the metal sublayer to the superalloy. This phenomenon is called "interdiffusion".

Interdiffusion can lead to the formation of primary and secondary reaction zones (SRZ) in a portion of the substrate in contact with the sublayer.

FIG. 2 is a microphotograph of the section of a sublayer 3 overlying a substrate 2. The microphotograph is taken before the component is subjected to a series of thermal cycles to simulate the temperature working conditions of the component 1. The substrate 2 is rich in rhenium, i.e. the average mass fraction of rhenium is greater than 0.04. It is known to use rhenium in the composition of superalloys to increase the creep resistance of superalloy parts. It is also known to use superalloys having a low average chromium mass fraction, i.e. less than 0.08, to increase the oxidation and corrosion resistance of the structure when the substrate is rich in rhenium. Typically, the substrate 2 has a γ-γ' Ni phase. The substrate 3 is of the β-NiAlPt type. The substrate has a primary interdiffusion zone 5, in the part of the substrate 2 directly covered by the sublayer 3. The substrate 2 also has a secondary interdiffusion zone 6, directly overlaid by the primary interdiffusion zone 5. The thickness of the secondary interdiffusion zone shown in FIG. 2 is approximately 35 μm and more generally between 20 and 50 μm.

FIG. 3 is a microphotograph of the section of the sublayer 3 overlying the substrate 2. The microphotograph shows the sublayer 3 and the substrate 2 after subjecting them to the series of thermal cycles described above. The sublayer 3 covers the substrate 2. The substrate 2 has a primary interdiffusion zone 5 and a secondary interdiffusion zone 6. Locally, the thickness of the secondary interdiffusion zone can be greater than 100 μm and can be as thick as 150 μm, as represented by the white segment in FIG. 3.

The combination of a rhenium-containing, low-chromium superalloy with a β-NiAlPt type sublayer leads to the formation of secondary reaction zones. The formation of secondary reaction zones strongly degrades the mechanical properties (creep, fatigue) of the superalloy by causing cracks 8 and/or high mechanical stress in the substrate 2 by subjecting the component 1 to high temperature conditions, for example above 1000° C.

Thus, interdiffusions between the superalloy substrate and the sublayer can have adverse consequences on the service life of the superalloy part.

SUMMARY OF THE INVENTION

A purpose of the invention is to provide a solution to effectively protect a superalloy turbine component from oxidation and corrosion while increasing its service life, during use, compared to known components.

This goal is achieved in the present invention by means of a turbine component comprising a substrate made of a single-crystal nickel-based superalloy, comprising rhenium, having a γ-γ' Ni phase, and an average chromium mass fraction of less than 0.08, a nickel-based metal superalloy sublayer covering the substrate, characterized in that the metal superalloy sublayer comprises at least aluminum, nickel, chromium, silicon, hafnium and has a γ'-$Ni_3Al$ phase predominantly by volume.

As the metal sublayer has an allotropic structure close to the substrate structure, the formation of secondary reaction zones is prevented and/or limited. Thus, the formation of cracks in the substrate of a component subjected to high temperature conditions, for example above 1000° C., as well as spalling of the protective aluminum oxide layer is limited or prevented.

In addition, because the metal sublayer comprises aluminum, while having a predominantly bulk γ'-$Ni_3Al$ phase, the metal sublayer can be oxidized to form a protective aluminum layer for a longer time, under working conditions, than using known metal sublayers.

In addition, the turbine component may have the following characteristics:

the sublayer also has a γ-Ni phase;
the average rhenium mass fraction of the substrate is greater than 0.04;

the average platinum mass fraction of the sublayer is between 0 and 0.05;

the average aluminum mass fraction of the sublayer is between 0.06 and 0.25;

the average chromium mass fraction of the sublayer is between 0.07 and 0.20;

the average hafnium mass fraction of the sublayer is less than 5%;

the average silicon mass fraction of the sublayer is less than 5%;

the sublayer further comprises at least one element selected from cobalt, molybdenum, tungsten, titanium and tantalum;

a protective layer of aluminum oxide covers the sublayer;

a thermally insulating ceramic layer covers the protective layer;

the thickness of the sublayer is between 5 μm and 50 μm.

The invention further relates to a process for manufacturing a turbine component comprising a step of vacuum deposition of a sublayer of a nickel-based superalloy having a γ'-Ni$_3$Al phase predominantly in volume, as well as optionally a γ-Ni phase, on a nickel-based superalloy substrate comprising rhenium and having a γ-γ' Ni phase.

The deposition can be carried out by a method selected from physical vapor deposition, thermal spraying (for example by a high-velocity oxygen fuel, or HVOF, system), joule evaporation, pulsed laser ablation and sputtering.

The sublayer can be deposited by co-spraying and/or co-evaporating targets of different metallic materials.

PRESENTATION OF THE DRAWINGS

Other features and advantages will be further highlighted in the following description, which is purely illustrative and non-limiting, and should be read in conjunction with the appended figures, among which:

Figure 4:
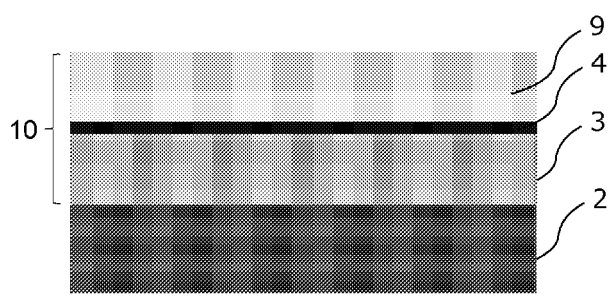

FIG. 4 schematically illustrates a thermal barrier section covering the substrate of a turbine component according to an embodiment of the invention.

DEFINITIONS

The term "superalloy" refers to a complex alloy with very good resistance to oxidation, corrosion, creep and cyclic (especially mechanical or thermal) stress at high temperature and pressure. Superalloys have a particular application in the manufacture of components used in aeronautics, for example turbine blades, as they constitute a family of high-strength alloys that can work at temperatures relatively close to their melting points (typically 0.7 to 0.8 times their melting temperatures).

A superalloy may have a two-phase microstructure comprising a first phase (called "γ phase") forming a matrix, and a second phase (called "γ' phase") forming precipitates hardening in the matrix.

The "base" of the superalloy is the main metal component of the matrix. In the majority of cases, superalloys include an iron, cobalt, or nickel base, but sometimes also a titanium or aluminum base.

"Nickel-base superalloys" have the advantage of offering a good compromise between oxidation resistance, high temperature fracture resistance and weight, which justifies their use in the hottest components of turbojet engines.

Nickel-base superalloys consist of a γ phase (or matrix) of the face-centered austenitic cubic γ-Ni type, optionally containing additives in solid solution of a substitution (Co, Cr, W, Mo), and a γ' phase (or precipitates) of the γ'-Ni$_3$X type, with X=Al, Ti or Ta. The γ' phase has an ordered $L_{12}$ structure, derived from the face-centered cubic structure, coherent with the matrix, i.e. having an atomic lattice very close thereto.

Due to its orderly character, the γ' phase has the remarkable property of having a mechanical resistance that increases with temperature up to about 800° C. The very strong coherence between the γ and γ phases confers a very high hot mechanical strength of nickel-based superalloys, which itself depends on the ratio γ/γ and the size of the hardening precipitates.

A superalloy is, in all the embodiments of the invention, rich in rhenium i.e. the average rhenium mass fraction of the superalloy is greater than 0.04, making it possible to increase the creep resistance of superalloy components compared with components made of rhenium-free superalloys. A superalloy is also, in all the embodiments of the invention, low in chromium, i.e. the average chromium mass fraction is less than 0.08, preferentially less than 0.05, in order to increase the oxidation resistance of the structure when rhenium is present in the superalloy.

Nickel-based superalloys thus generally have a high mechanical strength up to 700° C., then a mechanical strength that decreases sharply above 800° C.

The term "mass fraction" means the ratio of the mass of an element or group of elements to the total mass.

DETAILED DESCRIPTION OF THE INVENTION

FIG. 4 schematically illustrates a section of thermal barrier 10 covering the substrate 2 of a turbine component 1 conforming to an embodiment of the invention.

Figure 1:
FIG. 1 shows a schematic diagram of the cross-section of a turbine component, for example a turbine blade or a nozzle vane.
Figure 2:
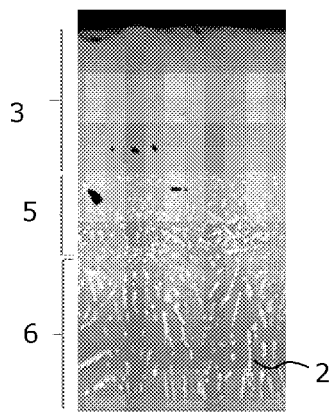
FIG. 2 is a microphotograph of the section of a sublayer overlying a substrate.
Figure 3:
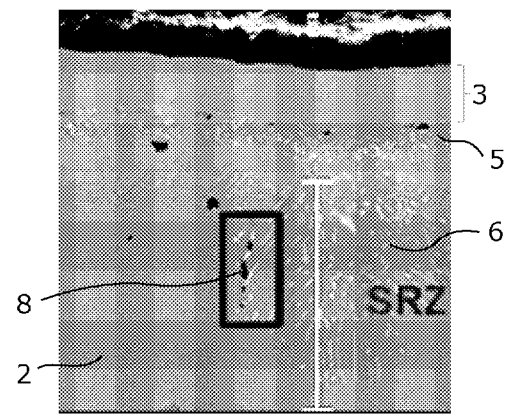
FIG. 3 is a microphotograph of the section of a sublayer 3 overlying a substrate.

The elements shown in FIG. 4 may be independently representative of the elements of a turbine blade 7 as shown in FIG. 1, a nozzle vane, or any other element, part or component of a turbine.

The substrate 2 is formed from nickel-base superalloy. The average mass fraction of the rhenium substrate 2 is greater than 0.04 and preferentially between 0.045 and 0.055. Preferentially, the average mass fraction of the substrate in chromium is low, i.e. less than 0.08 and preferably less than 0.05.

The thermal barrier 10 consists of a metal sublayer 3, a protective layer 4 and a thermally insulating layer 9.

The substrate 2 is covered by the metal sublayer 3. The metal sublayer 3 is covered by the protective layer 4. The protective layer 4 is covered by the thermally insulating layer 9.

The deposition of a metal sublayer 3 with an allotropic structure close to the structure of the substrate 2 prevents the formation of secondary reaction zones. In particular, the deposited sublayer 3 has a γ phase and a γ' phase, like the substrate.

The sublayer 3 has an alumino-forming composition, allowing the component to resist oxidation and corrosion. In particular, the majority of the volume of the sublayer 3 has a γ'-Ni$_3$Al phase. Preferentially, the sublayer 3 also has a γ-Ni phase. The sublayer 3 thus presents both a structure close to the structure of the substrate 2, while comprising an aluminum reserve allowing it to form a protective layer 4 of aluminum oxide by oxidation, for a longer time, compared with a sublayer presenting a γ-Ni majority phase in which the aluminum mass fraction is smaller. Preferentially, the average mass fraction of the aluminum sublayer 3 is between 0.06 and 0.25 and preferentially between 0.06 and 0.12.

Table 1, below, shows examples of compositions of the nickel-base superalloy sublayer 3. The different compositions are designated by the letters A to C. The mass fractions, in percent, of the sublayer 3 with a γ-phase, and the volume fraction of the sublayer 3 with a γ'-phase, are also described for a sublayer 3 that has been heat treated at 1000° C.

TABLE 1

|   | Ni | Co | Mo | Cr | W | Al | Ti | Ta | Pt | Hf | Si | 1000° C. %γ | %γ' |
|---|----|----|----|----|----|----|----|----|----|----|----|----|----|
| A | Base |  |  | 9-17 |  | 6-12 |  |  | 0-5 | 0-5 | 0-5 |  |  |
| B | Base |  |  | 12 |  | 9.5 |  |  | 0 | 1.7 | 0.6 | 15 | 85 |
| C | Base |  |  | 16 |  | 7.8 |  |  | 0 | 1.7 | 1.5 | 40 | 60 |

The composition A corresponds to a sublayer 3 of the NiCrAlHfSiPt type and has a majority phase γ'-Ni$_3$Al and a phase γ-Ni. The composition B corresponds to a sublayer 3 of NiCrAlHfSi type and has a majority phase γ'-Ni$_3$Al and preferentially a γ-Ni phase. For a sublayer 3 having undergone heat treatment at 1100° C., the mass fraction of the sublayer 3 presenting a γ phase is 40 mass % and the mass fraction of the sublayer 3 presenting a γ' phase is 60 mass %. The composition C corresponds to a sublayer 3 of the NiCrAlHfSi type and has a majority γ'-Ni$_3$Al phase and a γ-Ni phase.

In general, the sublayer 3 preferentially has a mean platinum mass fraction of less than 0.02 and/or a mean chromium mass fraction of between 0.07 and 0.17. Thus, the oxidation resistance of the component is increased.

The sublayer 3 can be deposited in a vacuum, for example by means of physical vapor deposition (PVD). Different PVD methods can be used for the manufacture of the sublayer 3, such as sputtering, joule evaporation, laser ablation and electron beam assisted physical vapor deposition. The sublayer 3 can also be deposited by thermal spraying.

Thus, the sublayer 3 can be deposited on the substrate 2 without using a method of sublayer formation by diffusion of chemical elements into the substrate 2, such as platinum. These deposition methods also simplify the formation of the sublayer 3 on the substrate 2 and allow better control of the chemical compositions of the sublayer 3. They also make it possible to deposit a sublayer 3 with a γ'-Ni$_3$Al phase, and optionally a γ-Ni phase, contrary to known methods.

Several targets of different metallic materials can be used in parallel, simultaneously, when depositing a sublayer 3. This type of deposition can be carried out by co-evaporation or by co-sputtering: the rate, respectively of evaporation or sputtering imposed on each target during the deposition of the sublayer 3 then determines the stoichiometry of said layer.

The invention claimed is:

1. A turbine component comprising:
a substrate of single-crystal nickel-based superalloy, comprising rhenium, having a γ-γ' Ni phase, and an average chromium mass fraction of less than 0.08; and
a nickel-based metal superalloy sublayer covering the substrate,
wherein:
the metal superalloy sublayer comprises at least aluminum, nickel, chromium, silicon, and hafnium and has a γ'-Ni3Al phase predominantly by volume, and
the turbine component further comprises an aluminum oxide protective layer covering the sublayer.

2. The component of claim 1, wherein the sublayer also has a γ-Ni phase.

3. The component of claim 1, wherein the average rhenium mass fraction of the substrate is greater than 0.04.

4. The component of claim 1, wherein an average platinum mass fraction of the sublayer is less than 0.05.

5. The component of claim 1, wherein the average aluminum mass fraction of the sublayer is between 0.06 and 0.25.

6. The component of claim 1, wherein the average chromium mass fraction of the sublayer is between 0.07 and 0.20.

7. The component of claim 1, wherein the average hafnium mass fraction of the sublayer is less than 5%.

8. The component of claim 1, wherein the average silicon mass fraction of the sublayer is less than 5%.

9. The component of claim 1, wherein the sublayer further comprises at least one element selected from cobalt, molybdenum, tungsten, titanium, and tantalum.

10. The component of claim 1, further comprising a thermally insulating ceramic layer covering the protective layer.

11. The component of claim 1, wherein the thickness of the sublayer is between 5 μm and 50 μm.

12. A process for manufacturing a turbine component comprising:
vacuum deposition of a sublayer of a nickel-based metal superalloy comprising at least aluminum, nickel, chromium, silicon, and hafnium, and having, predominantly in volume, a γ'-Ni3Al phase, as well as optionally a γ-Ni phase, on a substrate of single-crystal nickel-based superalloy comprising rhenium and having a γ-γ' Ni phase and an average chromium mass fraction of less than 0.08; and
formation of an aluminum oxide protective layer on the sublayer.

13. The process of claim 12, wherein the vacuum deposition is carried out by a method selected from physical vapor deposition, thermal spraying, joule evaporation, pulsed laser ablation and sputtering.

14. The process as claimed in claim 12, wherein the sublayer is deposited by at least one of co-spraying and co-evaporating targets of different metallic materials.

* * * * *